United States Patent
Jang et al.

(10) Patent No.: US 10,083,763 B2
(45) Date of Patent: Sep. 25, 2018

(54) IMPEDANCE CALIBRATION CIRCUIT AND SEMICONDUCTOR MEMORY DEVICE INCLUDING THE SAME

(71) Applicant: SK hynix Inc., Icheon-si, Gyeonggi-do (KR)

(72) Inventors: Dong Wook Jang, Icheon-si (KR); Kwan Su Shon, Icheon-si (KR); Yo Han Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/424,547

(22) Filed: Feb. 3, 2017

(65) Prior Publication Data

US 2018/0114586 A1  Apr. 26, 2018

(30) Foreign Application Priority Data

Oct. 25, 2016  (KR) .................. 10-2016-0139145

(51) Int. Cl.
*G11C 29/50* (2006.01)
*H03K 19/00* (2006.01)

(52) U.S. Cl.
CPC ... *G11C 29/50008* (2013.01); *H03K 19/0005* (2013.01)

(58) Field of Classification Search
CPC ......... H03K 19/0005; H03K 19/01825; H03K 19/017545; H03K 19/018557; G11C 29/50008
USPC .......................................................... 326/30
See application file for complete search history.

(56) References Cited

U.S. PATENT DOCUMENTS

| | | | | |
|---|---|---|---|---|
| 8,878,564 | B2* | 11/2014 | Araki | H03K 19/00369 324/108 |
| 9,077,332 | B2* | 7/2015 | Ko | H03K 19/0005 |
| 9,559,691 | B1* | 1/2017 | Kim | H03K 19/0005 |
| 2008/0211534 | A1* | 9/2008 | Jeong | G11O 5/063 326/30 |
| 2008/0253201 | A1* | 10/2008 | Lee | G11O 5/063 365/189.07 |
| 2011/0216612 | A1* | 9/2011 | Ishikawa | G11C 7/00 365/194 |
| 2012/0092039 | A1* | 4/2012 | Lee | G11C 7/02 326/30 |

(Continued)

FOREIGN PATENT DOCUMENTS

KR  1020160138627 A  12/2016

*Primary Examiner* — Dylan White
(74) *Attorney, Agent, or Firm* — William Park & Associates Ltd.

(57) ABSTRACT

An impedance calibration circuit may be provided. The impedance calibration circuit may include an adjusting circuit. The adjusting circuit may be configured to generate a calibration code based on a variation voltage, which may be applied to a calibration node coupled to a calibration pad, and a reference voltage. The adjusting circuit may be configured to apply a voltage, which may be generated according to a control signal generated based on an operational voltage mode in accordance with the calibration code, to the calibration node. The adjusting circuit may include a plurality of leg circuits. At least one of the leg circuits may include a plurality of legs configured to be selectively coupled to the calibration node based on the control signal.

8 Claims, 6 Drawing Sheets

(56) References Cited

U.S. PATENT DOCUMENTS

2014/0002130 A1\* 1/2014 Jang ..................... H03K 17/16
326/30

\* cited by examiner

IMPEDANCE CALIBRATION CIRCUIT AND SEMICONDUCTOR MEMORY DEVICE INCLUDING THE SAME

CROSS-REFERENCES TO RELATED APPLICATION

The present application claims priority under 35 U.S.C. § 119(a) to Korean application number 10-2016-0139145, filed on Oct. 25, 2016, in the Korean Intellectual Property Office, which is incorporated herein by reference in its entirety.

BACKGROUND

1. Technical Field

Various embodiments may generally relate to a semiconductor integrated circuit device, and more particularly, to an impedance calibration circuit and a semiconductor memory device including the same.

2. Related Art

A semiconductor memory device consists of a receiver circuit configured to receive a signal from an external device, and a transmitter circuit configured to transmit a signal within the semiconductor memory device.

The signals of the receiver circuit and the transmitter circuit in the semiconductor memory device have a swing width related to a speed of the semiconductor memory device. As the speed of the semiconductor memory device increases, the swing width decreases to minimize a delay time for transmitting the signal.

When the swing width of the signal is decreased, influences caused by external noises increase. Further, an impedance mismatch may be generated at an impedance terminal of the semiconductor memory device.

The impedance mismatch is caused by the external noises, variations of a power voltage, variations of an operational voltage, variations of a fabrication process, etc.

Therefore, in order to ensure a rapid transmission of data and to output reliable data, it may be required to perform an impedance match.

The semiconductor memory device may be operated by a plurality of operational voltages. It may be required to perform the impedance match with levels of the operational voltages.

SUMMARY

According to an embodiment, there may be provided an impedance calibration circuit. The impedance calibration circuit may include an adjusting circuit. The adjusting circuit may be configured to generate a calibration code based on a variation voltage, which may be applied to a calibration node coupled to a calibration pad, and a reference voltage. The adjusting circuit may be configured to apply a voltage, which may be generated according to a control signal generated based on an operational voltage mode in accordance with the calibration code, to the calibration node. The adjusting circuit may include a plurality of leg circuits. At least one of the leg circuits may include a plurality of legs configured to be selectively coupled to the calibration node based on the control signal.

According to an embodiment, there may be provided a semiconductor memory device. The semiconductor memory device may include an impedance calibration circuit and a data input and output (input/output) driver. The impedance calibration circuit may include an adjusting circuit. The adjusting circuit may be configured to generate a calibration code based on a variation voltage, which may be applied to a calibration node coupled to a calibration pad, and a reference voltage. The adjusting circuit may be configured to apply a voltage, which may be generated according to a control signal generated based on an operational voltage mode in accordance with the calibration code, to the calibration node. The data input/output driver may be configured to adjust an impedance value based on the calibration code and the control signal. The adjusting circuit may include a plurality of leg circuits. At least one of the leg circuits may include a plurality of legs configured to be selectively coupled to the calibration node based on the control signal.

DETAILED DESCRIPTION

Figure 1:
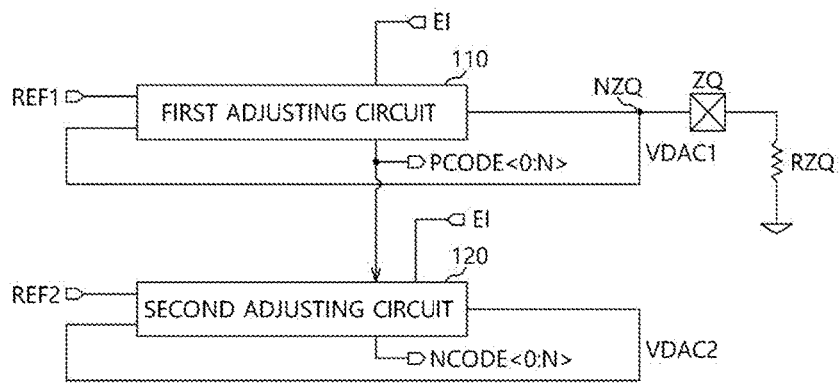
FIG. 1 is a circuit diagram illustrating an example of a representation of an impedance calibration circuit according to an embodiment.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a circuit diagram illustrating an example of a representation of an impedance calibration circuit according to an embodiment.

Referring to FIG. 1, an impedance calibration circuit 10 of an example of an embodiment may include a pad ZQ, a first adjusting circuit 110 and a second adjusting circuit 120.

The pad ZQ may correspond to a calibration pad. The pad ZQ may be electrically connected between a calibration node NZQ and an external resistance RZQ. The external resistance RZQ may have a uniform resistance value regardless of condition changes of a process, a voltage and a temperature (PVT). The resistance value of the external resistance RZQ may be changed in accordance with example embodiments of a semiconductor device to the impedance calibration circuit 10 may be applied.

The first adjusting circuit 110 may compare a first variation voltage VDAC1 applied to the calibration node NZQ with a first reference voltage REF1 (VREFA and VREFB denoted in FIG. 2 or VREF1 denoted in FIG. 3) to generate a first control code PCODE<0:N>. The first adjusting circuit 110 may convert the first control code PCODE<0:N>into the first variation voltage VDAC1 based on a control signal EI. That is, the first adjusting circuit 110 may apply a voltage generated by the first control code PCODE<0:N>based on the control signal El to the calibration node NZQ.

The second adjusting circuit 120 may compare a second variation voltage VDAC2 with a second reference voltage REF2 (VREFA and VREFB denoted in FIG. 2 or VREF2 denoted in FIG. 3) to generate a second control code NCODE<0:N>. The second adjusting circuit 120 may convert the second control code NCODE<0:N>into the second variation voltage VDAC2 based on the control signal El. That is, the second adjusting circuit 120 may apply a voltage generated by the second control code NCODE<0:N>based on the control signal El to a node to which the second variation voltage VDAC2 may be applied.

In an embodiment, the control signal EI may be provided from a controller. The controller may generate the control signal EI based on a mode register set MRS in accordance with operational voltage modes of the semiconductor device.

For example, the semiconductor device may be operated less than about 1.2V or about 1.8V. In a first operational voltage mode where the semiconductor device may be operated at less than the 1.2V and a second operational voltage mode where the semiconductor device may be operated at less than the 1.8V, the control signal EI may be generated to generate the first variation voltage VDAC1 and the second variation voltage VDAC2 by different internal impedances.

That is, the impedance calibration circuit 10 may include the different internal impedances by the operational voltage modes by the control signal EI generated in accordance with the operational voltage modes of the semiconductor device.

Therefore, a calibration resistance RON of the impedance calibration circuit 10 may be determined in accordance with the control signal EI and the control codes PCODE<0:N> and NCODE<0:N>.

Figure 2:
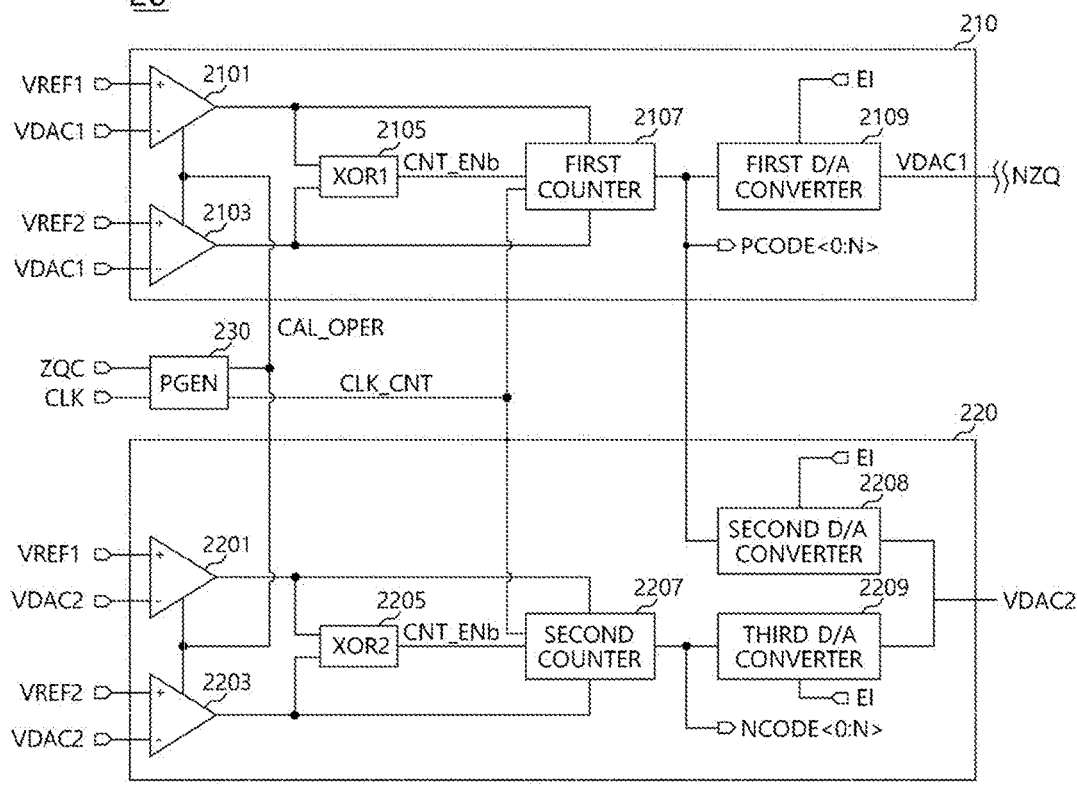
FIG. 2 is a circuit diagram illustrating an example of a representation of an impedance calibration circuit according to an embodiment.

FIG. 2 is a circuit diagram illustrating an example of a representation of an impedance calibration circuit according to an embodiment.

Referring to FIG. 2, an impedance calibration circuit 20 of an example of an embodiment may include a first adjusting circuit 210, a second adjusting circuit 220 and a pulse-generating unit (PGEN) 230.

The first adjusting circuit 210 may include a first comparator 2101, a second comparator 2103, a first logic circuit 2105, a first counter 2107 and a first digital-to-analog (D/A) converter 2109.

The first comparator 2101 may be configured to compare a first variation voltage VDAC1 with a first reference voltage VREF1 during an impedance adjust signal CAL_OPER that is activated.

The second comparator 2103 may be configured to compare a second variation voltage VDAC2 with a second reference voltage VREF2 during the impedance adjust signal CAL_OPER that is activated.

The first logic circuit 2105 may combine an output signal from the first comparator 2101 with an output signal from the second comparator 2103 to output a count enabling signal CNT_ENb.

The first counter 2107 may be driven by the count enabling signal CNT_ENb provided from the first logic circuit 2105. The first counter 2107 may increase or decrease a first control code PCODE<0:N> based on the output signals from the first and second comparator 2101 and 2103 in response to a count clock signal CLK_CNT.

The first D/A converter 2109 may be configured to determine an internal impedance in response to the control signal EI and the first control code PCODE<0:N>. The first D/A converter 2109 may apply a voltage generated in accordance with the first control code PCODE<0:N> to a first variation voltage apply node. In an embodiment, the first D/A converter 2109 may correspond to a pull-up driver. In this case, the first D/A converter 2109 may include a plurality of leg circuits. Each of the leg circuits may include at least one PMOS transistor. The first control code PCODE<0:N> may be applied by one bit to a gate terminal of the PMOS transistor in the leg circuit. Further, at least one of the leg circuits may include a plurality of legs selectively involved in generating the first variation voltage VDAC1 in response to the control signal EI. The legs in the leg circuit may be selectively coupled to the calibration node NZQ in response to the control signal EI.

That is, the internal impedance, which may be determined by the leg circuits in the first D/A converter 2109, may be determined by the control signal EI and the first control code PCODE<0:N>. Thus, the internal impedance of the first D/A converter 2109 may be changed in accordance with the operational voltage modes.

The second adjusting circuit 220 may include a third comparator 2201, a fourth comparator 2203, a second logic circuit 2205, a second counter 2207, a second D/A converter 2208 and a third D/A converter 2209.

The third comparator 2201 may be configured to compare a second variation voltage VDAC2 with the first reference voltage VREF1 during the impedance adjust signal CAL_OPER that is activated.

The fourth comparator 2203 may be configured to compare the second variation voltage VDAC2 with the second reference voltage VREF2 during the impedance adjust signal CAL_OPER that is activated.

The second logic circuit 2205 may combine an output signal from the third comparator 2201 with an output signal from the fourth comparator 2203 to output the count enabling signal CNT_ENb.

The second counter 2207 may be driven by the count enabling signal CNT_ENb provided from the second logic circuit 2205. The second counter 2207 may increase or decrease a second control code NCODE<0:N> based on the output signals from the third and fourth comparator 2201 and 2203 in response to the count clock signal CLK_CNT.

The second D/A converter 2208 may be configured to determine the internal impedance in response to the control signal EI and the first control code PCODE<0:N>. The second D/A converter 2208 may have configurations substantially the same as those of the first D/A converter 2109. The second D/A converter 2208 may be configured to copy the impedance of the first D/A converter 2109.

Therefore, at least one of leg circuits in the second D/A converter 2208 may include a plurality of legs selectively involved in generating the second variation voltage VDAC2 in response to the control signal EI. The legs in the leg circuit may be selectively coupled to an output node of the second variation voltage VDAC2 in response to the control signal EI.

The third D/A converter 2209 may be configured to determine an internal impedance in response to the control signal EI and the second control code NCODE<0:N>. The third D/A converter 2209 may apply a voltage generated in accordance with the second control code NCODE<0:N> to a node to which the second variation voltage node VDAC2 may be applied. In an embodiment, the third D/A converter 2209 may correspond to a pull-down driver. In this case, the third D/A converter 2209 may include a plurality of leg circuits. Each of the leg circuits may include at least one NMOS transistor. The second control code NCODE<0:N> may be applied by one bit to a gate terminal of the NMOS transistor in the leg circuit.

Further, at least one of the leg circuits in the third D/A converter 2209 may include a plurality of legs selectively involved in generating the second variation voltage VDAC2 in response to the control signal EI. The legs in the leg circuit may be selectively coupled to an output node of the second variation voltage VDAC2 in response to the control signal EI.

That is, the internal impedance, which may be determined by the leg circuits in the third D/A converter 2209, may be determined by the control signal EI and the second control code NCODE<0:N>. Thus, the internal impedance of the third D/A converter 2209 may be changed in accordance with the operational voltage modes.

The pulse-generating unit 230 may be configured to receive an impedance adjusting command ZQC and a clock signal CLK to generate the impedance control signal CAL_OPER and the count clock signal CLK_CNT.

Figure 3:
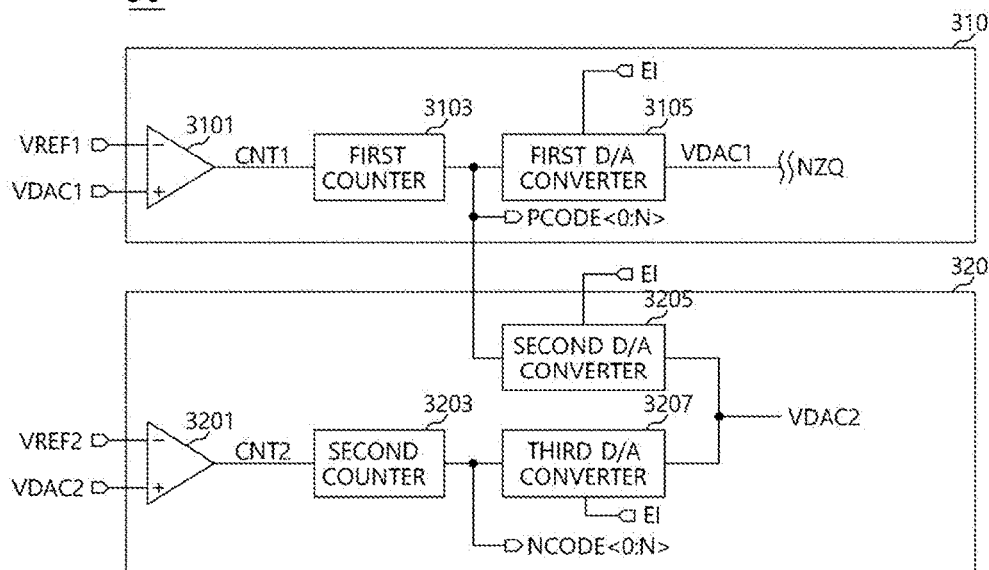
FIG. 3 is a circuit diagram illustrating an example of a representation of an impedance calibration circuit according to an embodiment.

FIG. 3 is a circuit diagram illustrating an example of a representation of an impedance calibration circuit according to an embodiment.

Referring to FIG. 3, an impedance calibration circuit 30 of an example of an embodiment may include a first adjusting circuit 310 and a second adjusting circuit 320.

The first adjusting circuit 310 may include a first comparator 3101, a first counter 3103 and a first D/A converter 3105. The second adjusting circuit 320 may include a second comparator 3201, a second counter 3203, a second D/A converter 3205 and a third D/A converter 3207.

The first comparator 3101 may be configured to compare a first variation voltage VDAC1 with a first reference voltage VREF1 to generate a first comparison signal CNT1.

The first counter 3103 may increase or decrease a first control code PCODE<0:N> in response to the first comparison signal CNT1.

The first D/A converter 3105 may be configured to determine an internal impedance in response to a control signal EI and the first control code PCODE<0:N>. The first D/A converter 3105 may convert the first control code PCODE<0:N> into the first variation voltage VDAC1.

In an embodiment, the first D/A converter 3105 may is correspond to a pull-up driver. In this case, the first D/A converter 3105 may include a plurality of leg circuits. Each of the leg circuits may include at least one PMOS transistor. The first control code PCODE<0:N> may be applied by one bit to a gate terminal of the PMOS transistor in the leg circuit.

Further, at least one of the leg circuits may include a plurality of legs selectively involved in generating the first variation voltage VDAC1 in response to the control signal EI. The legs in the leg circuit may be selectively coupled to the calibration node NZQ in response to the control signal EI.

That is, the internal impedance, which may be determined by the leg circuits in the first D/A converter 3105, may be determined by the control signal EI and the first control code PCODE<0:N>. Thus, the internal impedance of the first D/A converter 3105 may be changed in accordance with the operational voltage modes.

The second comparator 3201 may be configured to compare a second variation voltage VDAC2 with a second reference voltage VREF2 to generate a second comparison signal CNT2.

The second counter 3203 may increase or decrease a second control code NCODE<0:N> in response to the second comparison signal CNT2.

The second D/A converter 3205 may be configured to determine an internal impedance in response to the control signal EI and the first control code PCODE<0:N>. The second D/A converter 3205 may have configurations substantially the same as those of the first D/A converter 3105. The second D/A converter 3205 may be configured to copy the impedance of the first D/A converter 3105.

Therefore, at least one of leg circuits in the second D/A converter 3205 may include a plurality of legs selectively involved in generating the second variation voltage VDAC2 in response to the control signal EI. The legs in the leg circuit may be selectively coupled to an output node of the second variation voltage VDAC2 in response to the control signal EI.

That is, the internal impedance, which may be determined by the leg circuits in the second D/A converter 3205, may be determined by the control signal EI and the first control code PCODE<0:N>. Thus, the internal impedance of the second D/A converter 3205 may be changed in accordance with the operational voltage modes.

The third D/A converter 3207 may be configured to determine an internal impedance in response to the control signal EI and the second control code NCODE<0:N>. The second D/A converter 3207 may convert the second control code NCODE<0:N> into the second variation voltage VDAC2. In an embodiment, the third D/A converter 3207 may correspond to a pull-down driver. In this case, the third D/A converter 3207 may include a plurality of leg circuits. Each of the leg circuits may include at least one NMOS transistor. The second control code NCODE<0:N> may be applied by one bit to a gate terminal of the NMOS transistor in the leg circuit.

Further, at least one of the leg circuits in the third D/A converter 3207 may include a plurality of legs selectively involved in generating the second variation voltage VDAC2 in response to the control signal EI. The legs in the leg circuit may be selectively coupled to an output node of the second variation voltage VDAC2 in response to the control signal EI.

That is, the internal impedance, which may be determined by the leg circuits in the third D/A converter 3207, may be determined by the control signal EI and the second control code NCODE<0:N>. Thus, the internal impedance of the third D/A converter 3207 may be changed in accordance with the operational voltage modes.

Operations of the impedance calibration circuit 20 in FIG. 2 or 30 in FIG. 3 are discussed below.

At least one of the leg circuits in the first D/A converter 2109 and 3105 may include the legs selectively involved in generating the first variation voltage VDAC1 in response to the control signal EI.

At least one of the legs in the at least one leg circuit may be coupled to the calibration node NZQ by the control signal EI in accordance with the operational voltage modes. The leg circuits may be enabled in accordance with the first control code PCODE<0:N>, i.e., the leg circuits may be turned-on or turned-off to adjust the impedances of the first D/A converter 2109 and 3105. The adjusted impedances may have influence on the calibration node NZQ to change levels of the first variation voltage VDAC1. This pull-up operation may be repeated by the first adjusting circuit 210 and 310 until the impedance of the first D/A converter 2109 and 3105 may be substantially the same as that of the external resistance RZQ.

Further, a pull-down operation may be repeated until the second variation voltage VDAC2 may be substantially the same as the second reference voltage VREF2 similarly to the pull-up operation.

The first control code PCODE<0:N> may be inputted into the second D/A converter 2208 and 3205 so that the impedance of the second D/A converter 3205 may copy the impedance of the first D/A converter 2109 and 3105.

At least one of the legs in the at least one leg circuit of the third D/A converter 2209 and 3207 may be coupled to the output node of the second variation voltage VDAC2 in response to the control signal EI. The leg circuits may be turned-on or turned-off in accordance with the second control code NCOD<0:N> to adjust the impedance of the third D/A converter 2209 and 3207.

Therefore, when the calibrating operations may be completed, the first control code PCODE<0:N> may be generated to provide the external resistance RZQ and the first D/A converter 2109 and 3105 with the same impedance. Further, the second control code NCODE<0:N> may be generated to provide the second D/A converter 2208 and 3208 and the third D/A converter 2209 and 3207 with the same impedance.

The first control code PCODE<0:N> and the second control code NCODE<0:N> may correspond to the calibration code. The calibration code PCODE<0:N> and NOCD<0:N> may be transmitted to a termination code for terminating an interface node through which data may be inputted/outputted to adjust an impedance of a termination circuit.

The impedance calibration circuits 20 and 30 in FIGS. 2 and 3 are, for example, illustrated. However, the impedance calibration circuits may have other configurations for generating the calibration code PCODE<0:N>and NOCD<0:N>in accordance with the comparisons between the voltage of the calibration node NZQ and the reference voltages VREF1/VREF2, and for performing the impedance matching operations by determining the internal impedance in response to the calibration codes PCODE<0:N>and NOCDE<0:N>and the control signal El.

Figure 4:
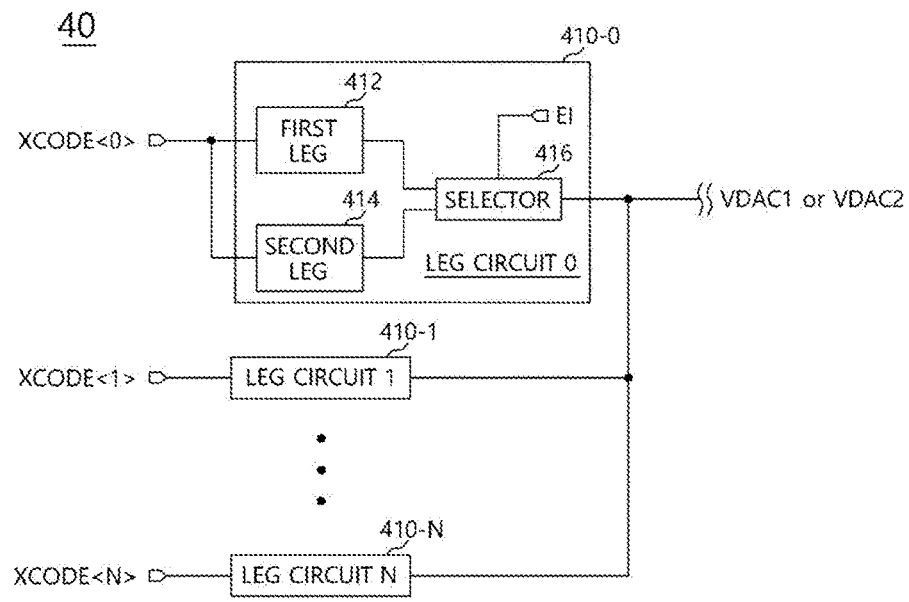
FIG. 4 is a circuit diagram illustrating an example of a representation of a digital-to-analog (digital/analog) converter according to an embodiment.

FIG. 4 is a circuit diagram illustrating an example of a representation of a digital-to-analog digital/analog converter according to an embodiment.

A digital-to-analog (D/A) converter 40 of an example of an embodiment may be applied to the first to third D/A converters 2109, 2208, 2209, 3105, 3205 and 3207 in FIGS. 2 and 3.

Referring to FIG. 4, the D/A converter 40 may include a plurality of leg circuits 410-0 to 410-N configured to be turned-on and turned-off (turned-on/turned-off) in response to a control code XCODE<0:N>. wherein, the control code XCODE<O:N>may be the first or the second control codes PCODE<O:N>and NCODE<O:N>.

At least one of the leg circuits 410-0 to 410-N, for example, a leg circuit 410-0 by modes may include a plurality of legs 412 and 414 selectively involved in determining a voltage level of an output node VDAC 1 or VDAC2 in response to a control signal El.

In an embodiment, the leg circuit 410-0 by the modes may include a first leg 412, a second leg 414 and a selector unit 416.

The first leg 412 and the second leg 414 may be enabled in response to a same control code XCODE<0>.

The selector 416 may control to selectively couple any one of the first leg 412 and the second leg 414 to the output node VDAC 1 or VDAC2 in response to the control signal EI.

When the D/A converter 40 in FIG. 4 includes the first D/A converter 2109 and 3105, the output node VDAC 1 or VDAC2 may correspond to the calibration node ZNQ, i.e., the output node of the first variation voltage VDAC1. When the D/A converter 40 in FIG. 4 includes the second D/A converter 2208 and 3205, the output node VDAC 1 or VDAC2 may correspond to the output node of the second variation voltage VDAC2.

Figure 5:
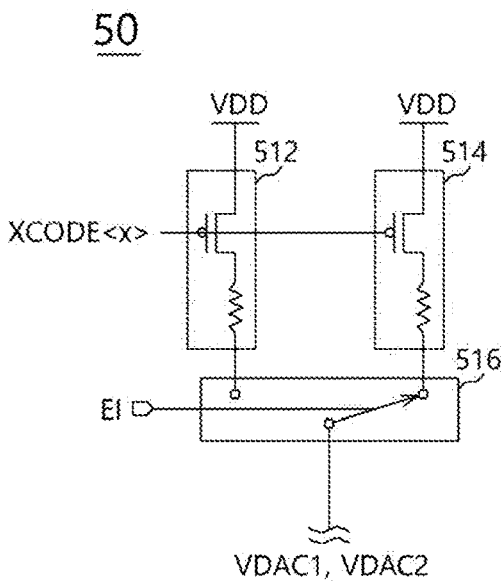
FIGS. 5 and 6 are circuit diagrams illustrating an example of a representation of a leg circuit according to embodiments.
Figure 6:
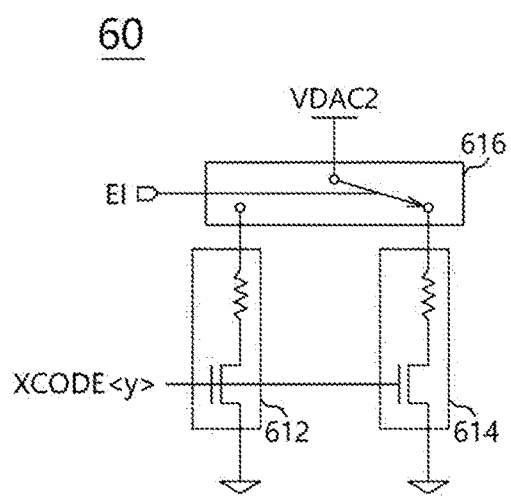

FIGS. 5 and 6 are circuit diagrams illustrating examples of representations of a leg circuit according to embodiments.

Referring to FIG. 5, a leg circuit 50 according to the different modes may be provided to the first D/A converter 2109 and 3105 or the second D/A converter 2208 and 3205. The leg circuit 50 may be controlled by the control signal EI.

The leg circuit 50 according to the different modes may include a first leg 512, a second leg 514 and a selector 516.

The first leg 512 and the second leg 514 may be turned-on or turned-off by a same control code XCODE<x>. In an embodiment, the first leg 512 may be . . . (The rest is omitted) In an embodiment, the first leg 512 may be enabled or turned-on by a code of any one bit of the calibration code or first and second control codes PCODE<0:N> and NCODE<0:N>. In an embodiment, the second leg 514 may be enabled or turned- on by a code of any one bit of the calibration code or first and second control codes PCODE<0:N> and NCODE<0:N>. The selector 516 may control to selectively couple any one of the first leg 512 and the second leg 514 to the output node of the first variation voltage VDAC1 or the second variation voltage VDAC2 in response to the control signal EI. In an embodiment, the first leg 512 may be coupled to a voltage VDD, and the second leg 514 may be coupled to a voltage VDD. In an embodiment, the first leg 512 and the second leg 514 may each include a transistor and a resistor.

The first leg 512 may have a resistance value different from that of the second leg 514. Thus, although the same control code XCODE<x>may be . . . (The rest is omitted) inputted into the first leg 512 and the second leg 514, the resistances of the leg circuit 50 may be changed in accordance with coupling of any one of the first and second legs 512 and 514 to the output nodes VDAC1 and VDAC2. Thus, the internal impedance of the D/A converter 40 may be changed.

When the D/A converter 40 in FIG. 4 includes the third D/A converter 2209 and 3207, the output node VDAC 1 or VDAC2 may correspond to the output node of the second variation voltage VDAC2.

Referring to FIG. 6, a leg circuit 60 having different modes may be provided to the third D/A converter 2209 and 3107, and may be controlled by the control signal EI.

The leg circuit 60 according to the different modes may include a first leg 612, a second leg 614 and a selector 616.

The first leg 612 and the second leg 614 may be turned-on or turned-off by a same control code XCODE<y>. In an embodiment, the first leg 612 may be . . . (The rest is omitted) enabled or turned-on by a code of any one bit of the calibration code or first and second control codes PCODE<0:N> and NCODE<0:N>. In an embodiment, the second leg 614 may be enabled or turned-on by a code of any one bit of the calibration conde or first and second control codes PCODE<0:N> and NCODE<0:N>. The selector 616 may control to selectively couple any one of the first leg 612 and the second leg 614 to the output node of the second variation voltage VDAC2 in response to the control signal EI. In an embodiment, the first leg 612 may be coupled to a ground voltage VSS, and the second leg 614 may be coupled to a ground voltage VSS. In an embodiment, the first leg 612 and the second leg 614 may each include a transistor and a resistor.

The first leg 612 may have a resistance value different from that of the second leg 614. Thus, although the same control code XCODE<y>may be . . . (The rest is omitted) inputted into the first leg 612 and the second leg 614, the resistances of the leg circuit 60 may be changed in accordance with coupling of any one of the first and second legs 612 and 614 to the output nodes VDAC2. Thus, the internal impedance of the D/A converter 40 may be changed.

Any one of the leg circuits may include the leg circuits 50 and 60 according to the different modes in FIGS. 5 and 6. Any one of the legs 512/514 and 612/614 in the leg circuits 50 and 60 may be selectively coupled to the output nodes VDAC1 and VDAC2 in response to the control signal EI.

The control signal EI may be a signal determined by the operational voltage modes. Because the legs 512/514 and 612/614 may have the different resistance values, different impedance values may be generated from the D/A converter 40 in accordance with the operational voltage modes although the same control code XCODE<0:N>may be inputted into the D/A converter 40.

Figure 7:
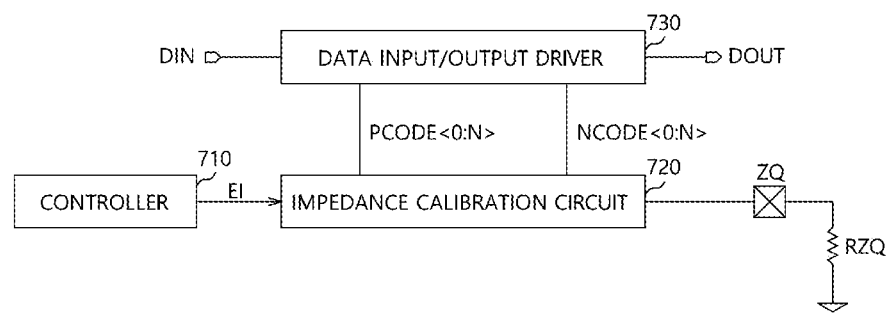
FIG. 7 is a block diagram illustrating an example of a representation of a semiconductor memory device according to an embodiment.

FIG. 7 is a block diagram illustrating an example of a representation of a semiconductor memory device according to an embodiment.

Referring to FIG. 7, a semiconductor memory device 70 may include a controller 710, an impedance calibration circuit 720 and a data input and output (input/output) driver 730.

The controller 710 may control the overall operation of the semiconductor memory device 70 in response to a signal such as the command or data signals provided from an external apparatus such as, for example but not limited to, a host apparatus. The controller 710 may control the semiconductor memory device 70 by internal commands without external commands.

The impedance calibration circuit 720 may electrically connect to calibration pad ZQ. The impedance calibration circuit 720 may generate the control codes PCODE<0:N> and NCODE<0:N> based on the resistance value of the external resistance RZQ according to control of the controller 710. The impedance calibration circuit 720 may determine the calibration resistance RON in accordance with the control signal EI provided from the controller 710 and the control codes PCODE<0:N> and NCODE<0:N>, and adjust the impedance value.

The impedance calibration circuit 720 may include any one of the circuits in FIGS. 1 to 3. Thus, the impedance calibration circuit 720 may perform the impedance matching operation in response to the control signal EI provided from the controller 710.

The data input/output driver 730 may receive input data DIN. The data input/output driver 730 may drive the input data DIN in accordance with the control codes PCODE<0:N> and NCODE<0:N> provided from the impedance calibration circuit 702 to generate output data DOUT.

A termination resistance RTT of the data input/output driver 730 may be determined in accordance with the control codes PCODE<0:N> and NOCDE<0:N> provided from the impedance calibration circuit 720. Thus, the impedance value corresponding to the output data DOUT may be equal to the impedance value of the external device configured to interface with the output data DOUT.

Figure 8:
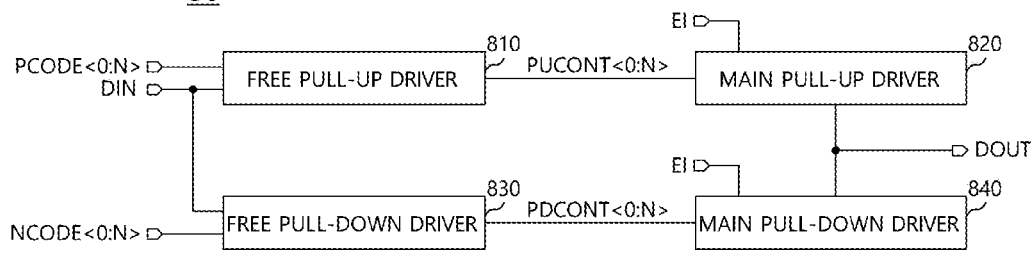
FIG. 8 is a block diagram illustrating an example of a representation of a D/Ata input/output driver according to an embodiment.

FIG. 8 is a block diagram illustrating an example of a representation of a data input/output driver according to an embodiment.

Referring to FIG. 8, a data input/output driver 80 of an example of an embodiment may include a free pull-up driver 810, a main pull-up driver 820, a free pull-down driver 830 and a main pull-down driver 840.

The free pull-up driver 810 may generate a pull-up control signal PUCONT<0:N> in response to the first control code PCODE<0:N> and the input data DIN provided from the impedance calibration circuit 720.

The free pull-down driver 830 may generate a pull-down control signal PDCONT<0:N> in response to the second control code NCODE<0:N> and the input data DIN provided from the impedance calibration circuit 720.

The main pull-up driver 820 may calibrate the impedance in response to the control signal EI and the pull-up control signal PUCONT<0:N>. The main pull-down driver 840 may calibrate the impedance in response to the control signal EI and the pull-down control signal PDCONT<0:N> to generate the output data DOUT.

In an embodiment, the main pull-up driver 820 may perform a pull-up operation with respect to the output data DOUT. A driving force of the main pull-up driver 820 may be adjusted by the pull-up control signal PUCONT<0:N>. The main pull-down driver 840 may perform a pull-down operation with respect to the output data DOUT. A driving force of the main pull-down driver 840 may be adjusted by the pull-down control signal PDCONT<0:N>.

In an embodiment, the main pull-up driver 820 may have configurations substantially the same as those of the first D/A converter 2109 and 3105. Further, the main pull-down driver 840 may have configurations substantially the same as those of the third D/A converter 2209 and 3207.

Figure 9:
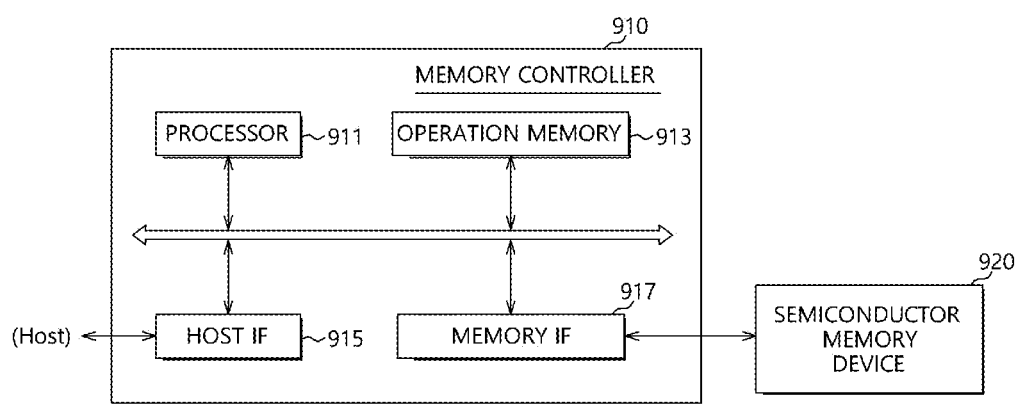
FIGS. 9 to 11 are block diagrams illustrating an example of a representation of electronic devices according to embodiments.
Figure 10:
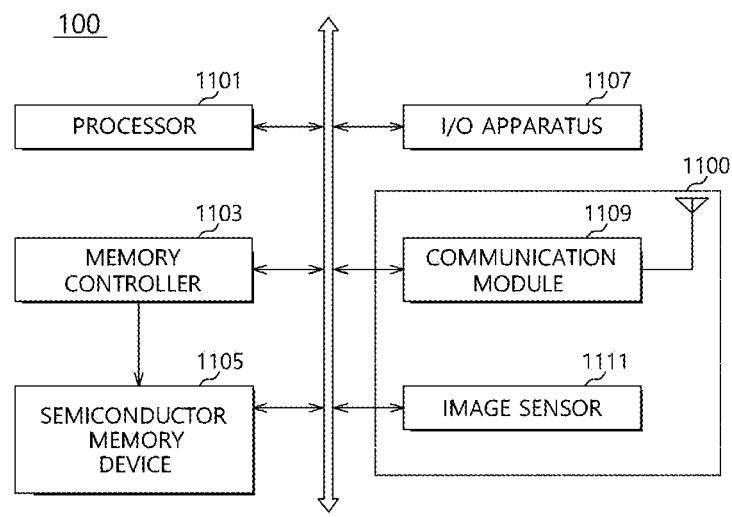
Figure 11:
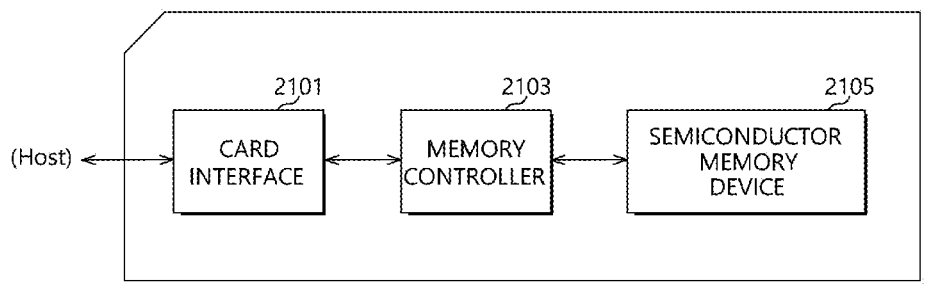

FIGS. 9 to 11 are block diagrams illustrating examples of representations of electronic devices according to embodiments.

Referring to FIG. 9, an electronic device 90 may include a memory controller 910 and a semiconductor memory device 920.

The memory controller 910 may be configured to access the semiconductor memory device 920 in response to commands of a host. The memory controller 910 may include a processor 911, an operation memory 913, a host interface (IF) 915 and a memory interface 917.

The processor 911 may control overall operations of the memory controller 910. The operation memory 913 may store applications, data, control signals, etc., for operating the memory controller 910.

The host interface 915 may perform protocol conversions for exchange data and control (data/control) signals between the host and the memory controller 910. The memory interface 917 may perform protocol conversions for exchange data/control signals between the memory controller 910 and the semiconductor memory device 920.

The semiconductor memory device 920 may include any one of the impedance calibration circuits 10, 20 and 30 in FIGS. 1 to 3. Thus, the semiconductor memory device 920 may perform the impedance matching operations in the operational voltage modes.

The electronic device in FIG. 9 may be used for a disc device, an internal and or external (internal/external) memory card of a portable electronic device, an image processor, an application chip set, etc.

Further, the operation memory 913 of the memory controller 910 may include any one of the impedance calibration circuits 10, 20 and 30 in FIGS. 1 to 3.

Referring to FIG. 10, an electronic device 100 may include a processor 1101, a memory controller 1103, a semiconductor memory device 1105, an input/output (I/O) apparatus 1107 and a function module 1100.

The memory controller 1103 may control a variety of data processing operations such as a write operation and a read operation of the semiconductor memory device 1105 in response to control signals of the processor 1101.

Data stored in the semiconductor memory device 1105 may be output through the I/O unit 1107 in response to control signals of the processor 1101 and the memory controller 1103. For example, the I/O unit 1107 may include a display unit, a speaker unit, and the like. The I/O unit 1107 may also include an input unit. The I/O unit 1107 may input a control signal for controlling an operation of the processor 1101 or may input data to be processed in the processor 1101 through the input unit.

In an embodiment, the memory controller 1103 may be implemented with a portion of the processor 1101 or a chipset separate from the processor 1101.

The semiconductor memory device 1105 may include any one of the impedance calibration circuits 10, 20 and 30 in FIGS. 1 to 3. Thus, the semiconductor memory device 1105 may perform the impedance matching operations in the operational voltage modes.

The function module 1100 may be a module that may perform a function selected according to an application example of the electronic device 100 illustrated in FIG. 10. Referring to FIG. 10, the function module 1100 may include a communication module 1109 and an image sensor 1111.

The communication module 1109 may provide a communication environment that enables the electronic device 100 to be connected to a wired or wireless communication network to exchange data and control signals.

The image sensor 1111 may convert an optical image to digital image signals and transfer the digital image signals to the processor 1101 and the memory controller 1103.

When the function module 1100 includes the communication module 1109, the electronic device 100 of FIG. 10 may be a portable communication apparatus such as a wireless communication terminal. When the function module 1100 may include the image sensor 1111, the electronic device 100 may be a digital camera, a digital camcorder, or an electronic system (for example, a personal computer [PC], a laptop computer, a mobile communication terminal, and the like) to which any one of the digital camera and the digital camcorder is attached.

Referring to FIG. 11, an electronic device 200 may include card interface 2101, a memory controller 2103 and a semiconductor memory device 2105.

The electronic device 200 in FIG. 11 may be used as a memory card or a smart card. Examples of the electronic device 200 illustrated in FIG. 11 may include a PC card, a multimedia card, an embedded multimedia card, a secure digital card, and a universal serial bus (USB) drive.

The card interface 2101 may provide an interface between a host and the memory controller 2103 according to a protocol of the host. In an embodiment, the card interface 2101 may be a hardware component that may support a protocol used in the host, or the card interface 2101 may be a software component installed in the hardware supporting the protocol used in the host. The card interface 2101 may also be a signal transmission method.

The memory controller 2103 may control data exchange between the semiconductor memory device 2105 and the card interface 701.

The semiconductor memory device 2105 may include any one of the impedance calibration circuits 10, 20 and 30 in FIGS. 1 to 3. Thus, the semiconductor memory device 2105 may perform the impedance matching operations in the operational voltage modes.

The above embodiments of the present disclosure are illustrative and not limitative. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. An impedance calibration circuit comprising:
   an adjusting circuit configured to generate a calibration code based on a variation voltage to which a calibration node coupled to a calibration pad is applied and a reference voltage, and to apply a voltage, which is generated by the calibration code according to a control signal generated based on an operational voltage mode, to the calibration node,
   wherein the adjusting circuit comprises a plurality of leg circuits, and at least one of the leg circuits comprises a plurality of legs selectively coupled to the calibration node based on the control signal,
   wherein the at least one of the leg circuit comprises:
      a first leg enabled by a code of any one bit of the calibration code;
      a second leg enabled by a code of any one bit of the calibration code; and
      a selector configured to selectively couple the first and second legs to an output node of the variation voltage,
   wherein the calibration code comprises a first control code and a second control code, and
   the adjusting circuit comprises:
      a first adjusting circuit configured to generate the first control code based on a first variation voltage applied to the calibration node and a first reference voltage and to apply a voltage, which is generated by the first control code based on the control signal, to the calibration node, and
      a second adjusting circuit configured to generate the second control code based on a second variation voltage and a second reference voltage and to apply a voltage, which is generated by the second control code based on the control signal, to a node to which the second variation voltage is applied,
   wherein the first adjusting circuit comprises:
      a first counter configured to generate the first control code based on the first reference voltage and the first variation voltage; and
      a first digital to analog (digital/analog) (D/A) converter having an impedance determined based on the first control code and the control signal.

2. The impedance calibration circuit of claim 1, wherein the first D/A converter comprises a plurality of leg circuits, and at least one of the leg circuits comprises a plurality of legs selectively coupled to the calibration node based on the control signal.

3. The impedance calibration circuit of claim 1, wherein the second adjusting circuit comprises:
   a second counter configured to generate the second control code based on the second reference voltage and the second variation voltage;
   a second digital/analog (D/A) converter having an impedance determined based on the first control code and the control signal; and
   a third digital/analog (D/A) converter having an impedance determined based on the second control code and the control signal.

4. The impedance calibration circuit of claim 3, wherein each of the second and third D/A converters comprises a plurality of leg circuits, and at least one of the leg circuits comprises a plurality of legs selectively coupled to the node to which the second variation voltage is applied based on the control signal.

5. The impedance calibration circuit of claim 1, wherein the first leg has a different resistance value from that of the second leg.

6. A semiconductor memory device comprising:
   an impedance calibration circuit configured to generate a calibration code based on a variation voltage to which a calibration node coupled to a calibration pad is applied and a reference voltage, and to apply a voltage, which is generated by the calibration code according to a control signal generated based on an operational voltage mode, to the calibration node; and
   a data input and output (input/output) driver configured to adjust impedance values based on the calibration code and the control signal,
   wherein the impedance calibration circuit comprises a plurality of leg circuits, and at least one of the leg circuits comprises a plurality of legs selectively coupled to the calibration node in response to the control signal,
   wherein the at least one of the leg circuit comprises:
      a first leg enabled by a code of any one bit of the calibration code;
      a second leg enabled by a code of any one bit of the calibration code; and
      a selector configured to selectively couple the first and second legs to an output node of the variation voltage,
   wherein the calibration code comprises a first control code and a second control code, and
   the impedance calibration circuit comprises:
      a first adjusting circuit configured to generate the first control code based on a first variation voltage applied to the calibration node and a first reference voltage and to apply a voltage, which is generated by the first control code based on the control signal, to the calibration node, and
      a second adjusting circuit configured to generate the second control code based on a second variation voltage and a second reference voltage and to apply a voltage, which is generated by the second control code based on the control signal, to a node to which the second variation voltage is applied,
   wherein the first adjusting circuit comprises:
      a first counter configured to generate the first control code based on the first reference voltage and the first variation voltage; and
      a first digital to analog (digital/analog) (D/A) converter having an impedance determined based on the first control code and the control signal.

7. The semiconductor memory device of claim 6, wherein the second adjusting circuit comprises:
   a second counter configured to generate the second control code based on the second reference voltage and the second variation voltage;

a second digital/analog (D/A) converter having an impedance determined based on the first control code and the control signal; and a third digital/analog (D/A) converter having an impedance determined based on the second control code and the control signal.

8. The semiconductor memory device of claim 6, wherein the first leg has a different resistance value from that of the second leg.

* * * * *